United States Patent [19]

Munakata et al.

[11] Patent Number: 4,672,578
[45] Date of Patent: Jun. 9, 1987

[54] METHOD OF INFORMATION RECORDING ON A SEMICONDUCTOR WAFER

[75] Inventors: Chusuke Munakata; Kunihiro Yagi, both of Nishitama; Masaru Miyazaki, Ohme; Shiyouzou Yoneda, Akishima, all of Japan

[73] Assignee: Hitachi, Ltd., Tokyo, Japan

[21] Appl. No.: 582,540

[22] Filed: Feb. 22, 1984

Related U.S. Application Data

[63] Continuation of Ser. No. 304,155, Sep. 21, 1981, abandoned.

[30] Foreign Application Priority Data

Sep. 19, 1980 [JP] Japan .................................. 55-129308

[51] Int. Cl.⁴ ...................... G11C 11/34; G11C 11/42
[52] U.S. Cl. .................................... 365/118; 365/114; 365/237
[58] Field of Search ............... 365/114, 118, 217, 237, 365/117; 346/135.1; 430/942; 427/307, 305

[56] References Cited

U.S. PATENT DOCUMENTS

| | | | |
|---|---|---|---|
| 3,497,698 | 2/1970 | Phelan et al. | 365/114 |
| 3,506,971 | 4/1970 | Sakurai | 365/114 |
| 3,746,867 | 7/1973 | Phelan et al. | 365/114 |
| 4,068,218 | 1/1978 | Likuski | 365/118 |
| 4,103,341 | 7/1978 | Brody | 365/117 |
| 4,126,901 | 11/1978 | Brody | 365/117 |
| 4,144,591 | 3/1979 | Brody | 365/117 |

FOREIGN PATENT DOCUMENTS

2456834 9/1975 Fed. Rep. of Germany ...... 365/118

OTHER PUBLICATIONS

Japanese Journal of Applied Physics–vol. 21, No. 9, Sep. 1982; pp. L555–L557.

*Primary Examiner*—James W. Moffitt
*Attorney, Agent, or Firm*—Antonelli, Terry & Wands

[57] ABSTRACT

An information recording method is provided, in which a p- or n-type semiconductor wafer is irradiated with an energetic particle beam such as an electron beam thereby to control, e.g., decreased or increased generation of the surface photovoltage at the irradiated area so that information may be recorded on the wafer.

20 Claims, 17 Drawing Figures

METHOD OF INFORMATION RECORDING ON A SEMICONDUCTOR WAFER

This is a continuation of application Ser. No. 304,155, filed Sept. 21, 1981 now abandoned.

BACKGROUND OF THE INVENTION

The present invention relates to a method of recording characters, an image, binary information or the like in high density on a semiconductor base plate on the basis of a novel recording principle.

Magnetic recording and read-out systems using magnetic (recording) tape is widely used at present as systems for semipermanently recording and storing various pieces of information and for reading them out when necessary. Nevertheless, since there is a limit in the fabrication accuracy of a magnetic head for such a system, the recording density of the magnetic recording system has a pitch of 1 μm at best so that a recording density at an interval of sub-microns cannot be expected. As a result, the magnetic system cannot be compact in both bulk and weight in view of the storage of a recording medium, and this raises a large obstacle in a recent information society.

If the recording density is at a pitch of 0.1 μm, the recording medium has its area and bulk reduced to one hundredth and one thousandth, respectively, relative to those in the case of 1 μm pitch so that the storage apparently becomes remarkably advantageous. Therefore, there have heretofore been made several proposals which are intended to perform the records at the 0.1 μm pitch.

From the macroscopic point of view, on the other hand, the recording operation is the same as as the writing operation of letters on a sheet of paper by means of a pencil, which requires the recording pencil and the suitable paper. In order to reduce the size of the letters written, moreover, there would apparently be required a pencil having a thin lead, paper of fine texture and an enlarger for observation.

From that analysis, there have heretofore been made a number of proposals in which a thin-focused charged particle beam (such as an electron beam or an ion beam) is used as the pencil having a thin lead.

Here, the principle of the prior art will be described merely as an example with reference to FIGS. 1A and 1B. As the recording medium, there is used a semiconductor junction (e.g., a p-n junction) which is constructed of an n-type semiconductor layer 2 and a p-type semiconductor layer 3, for example. Now, if the n-type semiconductor layer 2 is irradiated with an ion beam 1 which is accelerated to about 60 kV, for example, a lattice defect is generated in the irradiated area 4 because of the so-called "radiation damage" (as shown in FIG. 1A). If, at this state, the n-type semiconductor layer 2 is irradiated with an electron beam 5 which is accelerated to about 10 kV, carriers are generated in the n-type semiconductor layer 2, as is well known in the art (as shown in FIG. 1B). It is also known that a voltage is generated at the semiconductor junction because of the generation of those carriers. As a result, if two electrodes 6 and 6' are attached to the semiconductor layers 2 and 3, respectively, and are connected with a voltmeter 7, the generation of the voltage can be observed. Here, if the area 4 damaged by the irradiation is further irradiated with the electron beam 5, the generation of the carriers is obstructed by the radiation damage so that the indication of the voltmeter 7 is abruptly decreased. The area 4 written by the ion beam 1 can be detected by means of the electron beam 5. Since the ion beam 1 can be focused to have its diameter equal to or smaller than 1 μm, the recording pitch can also be reduced to match the diameter of the ion beam 1. Thus, it is apparent that the rise in the recording density can be expected.

However, the micro-recording method thus far described still has several defects over and above the difficulty in generating such an ion beam as has a high current density and a small diameter. More specifically, since the semiconductor junction is used as the recording medium, (1) the diffusion process for the p-n junction is required. Moreover, since the electrodes 6 and 6' are required for detecting a weak signal corresponding to the weakly recorded area 4, (2) the formation process for the electrodes is required. And, if the p-n junction is prepared by thermal diffusion, impurities diffuse in both the sides of the semiconductor wafer providing the base plate, as is well known in the art, so that the p-n junctions are formed in the two sides. As a result, since removal of at least one of the p=n junctions becomes necessary, the number of processes is further increased. On the contrary, if the p-n junction is prepared by the ion implantation process, an annealing process is added for the activation of the p-n junction, as is well known in the art. In either case, the number of the processes inclusive is increased. Still moreover, if the reuse of the recording medium is, required (3) both the steps of removing the electrodes and the junction are required.

FIGS. 2A to 2D show another recording example according to the prior art using an electron resist and an electron beam. Although there are many kinds of the electron resists, a PMMA resist of an acryl resin is suitable for the micro-recording operation. Usually, an optically opaque and electrically conductive metal film 9 is attached to a glass plate 8. An electron resist film 10, having a thickness of about 3000 Å, is coated upon the metal film 9 (as shown in FIG.-2A). A Cr film having a thickness of about 700 Å is frequently used as the metal film 9. If the resist film 10 is then irradiated with the electron beam 5 (as shown in FIG. 2B), the chemical bonds are broken in the case of the PMMA resist, for example, and the irradiated area 11 is removed during the developing process (as shown in FIG. 2C). Then, that resist film 10 is used as a mask to etch the metal film 9 and is finally removed. As shown in FIG. 2D, a micro-recorded area 11' is fixed as a hole in the metal film 9. As a result, the recorded area 11' can be read out by enlarging it with an optical microscope and by projecting it if it constitutes a letter, for example.

However, the method thus far described has so many fabrication processes that it is apparently unsuitable for processing much information. Moreover, the method shown in FIGS. 1A and 1B can effect the read-out immediately after the recording process using the ion beam, whereas the method shown in FIGS. 2A to 2D cannot effect the read-out so far as at least the developing process is ended.

SUMMARY OF THE INVENTION

It is, therefore, an object of the present invention to provide an information recording method which can record information on a semiconductor wafer by a remarkably simple process.

In order to achieve that object, the present invention is characterized in that a limited area of a bulk semiconductor base plate is irradiated with an energetic particle beam having sufficient energy to control generation of a surface photovoltage at the limited area so that information may be recorded on the bulk base plate.

By the method characterizing the present invention, the process required for recording information is remarkably simplified. As a result, such a recording medium can be fabricated at a low cost.

DETAILED DESCRIPTION

Fundamental Principle

First of all, the fundamental principle of the present invention will be described hereinafter.

When a semiconductor sample is irradiated with a light beam, electrons and positive holes are generated in pairs inside the semiconductor by the light energy. If those electrons and holes are separated by any mechanism, there is generated a voltage, which is generally called the "photovoltage". The best known one of the photovoltage generating mechanisms is that at a p-n junction. In the case of a p-n junction, the aforementioned electrons and holes produced by the light beam are separated by the high electric field existing in the junction, as is well known in the art.

If there exists an electric field due to another reason, the carriers generated by the light beam are separated without a p-n junction so that the photovoltage is generated. Especially, the photovoltage due to a high electric field at the surface of a semiconductor is called the "surface photovoltage" and has been well known in the art for Si and Ge since 1951.

In addition, there is the diffusion photovoltage which was reported in 1931 by Dember of Germany. The diffusion photovoltage is also called the "Dember voltage" after the discoverer. That voltage is generated, even when there exists no electric field in the semiconductor, and is caused by the fact that the diffusion velocities are different for electrons and holes. That diffusion photovoltage appears together with the surface photovoltage, and it is generally difficult to separately measure the two. The surface photovoltage is dominant for Si and Ge whereas the diffusion photovoltage is known to be dominant for CdS.

The fundamental principle of the present invention is that the aforementioned surface photovoltage is controlled with an energetic particle or photon beam such as an electron beam, an ion beam or a laser beam, an X-ray beam at the irradiated portion with the beam thereby to establish a difference in the photovoltage between the irradiated portion and the non-irradiated portion for information recording.

Now, how the surface photovoltages are controlled will be described in detail using the experimental results obtained by the Inventors. An electric field should be generated at the surface of a semiconductor so as to generate the surface photovoltage, as has been described hereinbefore.

Figure 3A:
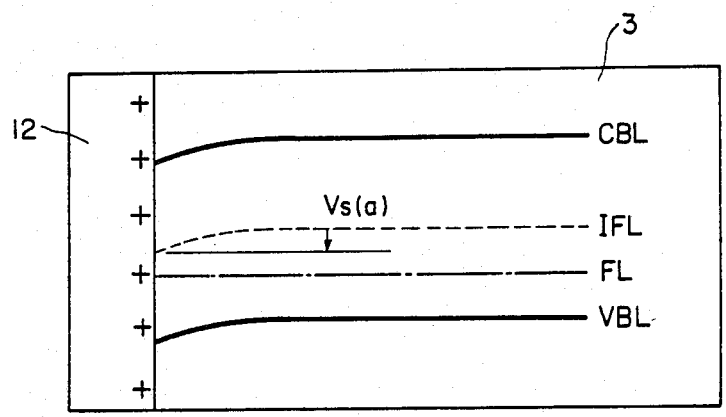
FIGS. 3A, 3B, 4A, 4B, 5A and 5B are energy level diagrams for illustrating the principle of the present invention, respectively.
Figure 3B:
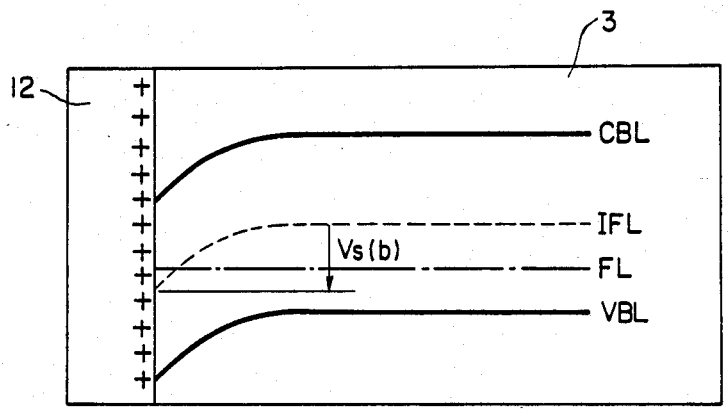

The following description is made by taking an Si base plate as an example of the semiconductor. If an oxide film (or layer) $SiO_2$ is formed on the surface of the Si base plate, positive charges are usually stored in the $SiO_2$ film so that the potential of the surface of the Si base plate is shifted in the positive direction downward in the energy level diagram. This is shown in FIGS. 3A and 3B in the case of the p-type Si base plate 3 if it is illustrated in energy level diagrams. More specifically, a conductive band level CBL, an intrinsic Fermi level IFL and a valence band level VBL are shifted in the positive (or downward) directions in the vicinity of the interface of an $SiO_2$ film 12, and the changes are indicated by surface potentials $V_s(a)$ and $V_s(b)$. A Fermi level FL is flat at a thermal equilibrium state.

Since the density of the positive charges in the $SiO_2$ film 12 is relatively low in FIG. 3A, the surface potential $V_s(a)$ is relatively low, whereas since the density of the positive charges in the $SiO_2$ film 12 is relatively high in FIG. 3B, the surface potential $V_s(b)$ is relatively high.

It is usually said that a depletion layer is formed at the semiconductor surface in the case of FIG. 3A, where the intrinsic Fermi level IFL is above the Fermi level FL. An inversion layer is formed in the case of FIG. 3B, where the intrinsic Fermi level IFL is below the Fermi level FL at the surface.

On the other hand, when the $SiO_2$ film is formed on the surface of an n-type Si base plate, the surface potential is also shifted in the positive direction. This case is differentiated from the foregoing two cases, and it is said that an accumulation layer is formed on the surface. However, this accumulation condition is not practical from the standpoint of the generation of the surface photovoltage. The surface photovoltage is usually very low.

Now, if the semiconductor, in which the surface potential $V_s$ is generated in the manners shown in FIGS. 3A and 3B, is irradiated with a light, a surface photovoltage is generated, as has been described hereinbefore. Moreover, the surface photovoltage is exponentially increased more as the surface potential $V_s$ becomes higher. Nevertheless, the closer the conduction band level CBL comes to the Fermi level FL, the less the surface potential increases. Therefore, the surface photovoltage is saturated when the conduction band level CBL closely approaches the Fermi level FL.

Next, let it be considered that the surface of the Si base plate 3, in which the surface potential $V_s$ shown in FIGS. 3A and 3B is generated, is irradiated with the energetic particle beam such as the electron beam. If the surface of a semiconductor, especially, the surface (or interface) of the semiconductor having the $SiO_2$ film 12 is irradiated with the electron beam, surface states are newly generated. According to the experimental considerations of the Inventors, the surface states $N_{ss}$ to be generated by the irradiation with the electron beam are divided into two kinds with respect to the intrinsic Fermi level IFL. More specifically, it is assumed that acceptor levels are established between the conduction band level CBL and the intrinsic Fermi level IFL and that donor levels are established between the intrinsic Fermi level IFL and the valence band level VBL.

Figure 4A:
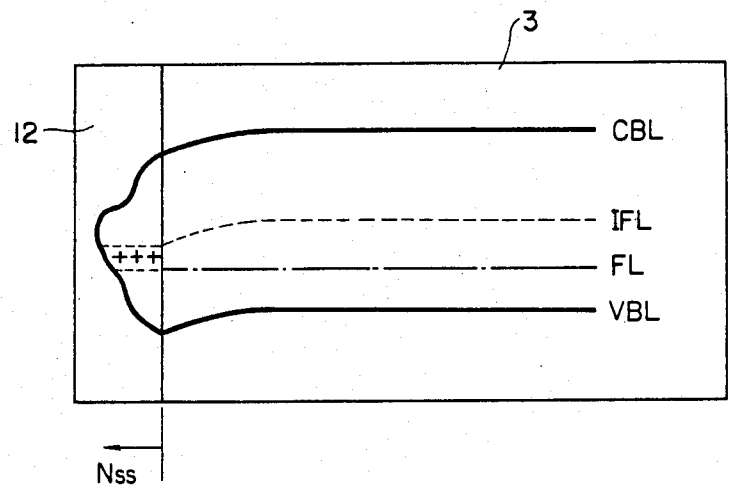

With this assumption, in case the irradiation with the electron beam is performed at the state shown in FIG. 3A, the donor levels at the interface of the irradiated portion between the intrinsic Fermi level IFL and the Fermi level FL are positively charged (as shown in FIG. 4A) to increase the positive charges in the $SiO_2$ film 12 so that the surface potential $V_s(a)$ at the irradiated portion is effectively shifted to a value greater than $V_s(a)$. As a result, the surface photovoltage increases by the irradiation with the electron beam.

Figure 4B:
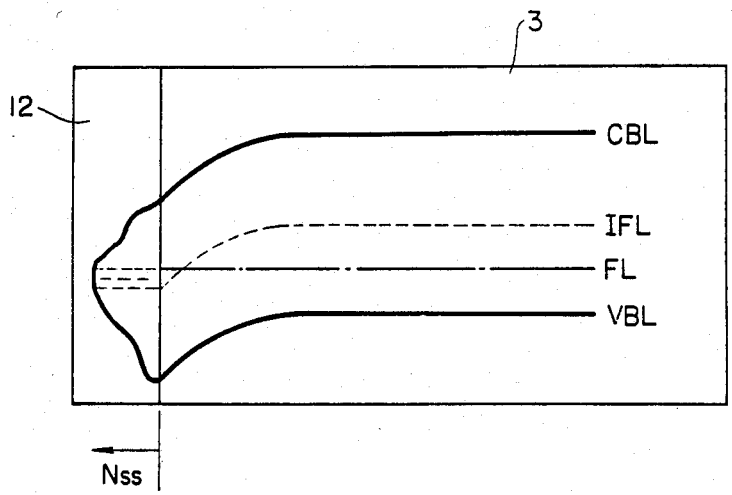

On the contrary, in case the irradiation with the electron beam is performed at the state shown in FIG. 3B, the acceptor levels at the interface of the irradiated portion between the Fermi FL and the intrinsic Fermi level IFL are negatively charged (as shown in FIG. 4B) to eliminate the positive charges in the $SiO_2$ film 12 so that the surface potential $V_s(b)$ at the irradiated portion is effectively shifted to a value less than $V_s(b)$. As a result, the surface photovoltage decreases by the irradiation with the electron beam. Although the foregoing description is illustrated in FIGS. 4A and 4B, the prerequisite for FIGS. 4A and 4B is the fact that the electrons are trapped or filled at the energy levels lower than the Fermi level FL. In FIGS. 4A and 4B, incidentally, arrows indicate the density of the surface states $N_{ss}$.

Figure 5A:
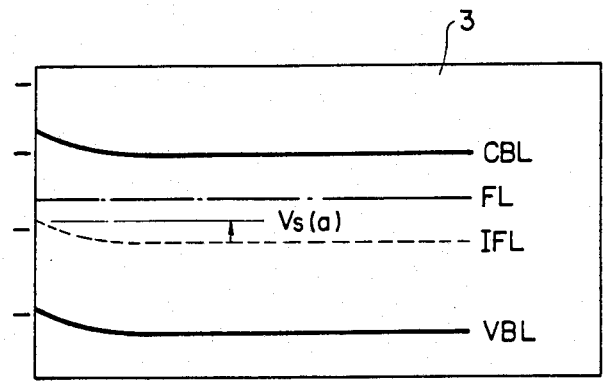
Figure 5B:
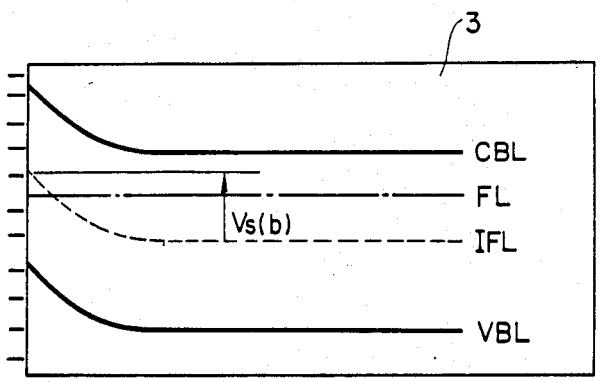

Although the description thus far made is directed to the case in which the semiconductor base plate 3 is made of p-type Si, the aforementioned depletion and inversion layers can also be formed in n-type Si. This is illustrated in FIGS. 5A and 5B by the use of the energy level diagrams. FIGS. 5A and 5B show the case in which the surface of the n-type Si base plate 3 is washed in an alkaline solution to fix negative charges thereon. Incidentally, the negative charges can also be generated on the surface of the p-type base plate, but in this case the accumulation layer is formed to generate very low surface photovoltage. This is similar to the case, in which the positive charges are generated on the surface of the n-type Si base plate, and is not practical, because the surface photovoltage is very low.

Now, if the n-type Si base plate 3 is irradiated with the electron beam in case there exist the negative surface potentials $V_s(a)$ and $V_s(b)$ in the manners shown in FIGS. 5A and 5B, the surface photovoltage is increased, in case there exists the depletion layer in the manner shown in FIG. 5A, but is decreased, in case there exists the inversion layer in the manner shown in FIG. 5B, by absolutely the same reason as that of the aforementioned case of the p-type Si base plate, although the charges, the electric field, the surface photovoltage and so on have their signs inverted.

The further accumulation of the experimental considerations has revealed the increasing effect of the surface photovoltage at the irradiated portion even if the base plate, which is prepared merely by washing the surface of such a p- or n-type semiconductor base plate in the solution of hydrofluoric and nitric acids as has failed to have the aforementioned oxide film and to be washed in the alkaline solution, is irradiated with the electron beam. In short, the washing process in the solution of the hydrofluoric and nitric acids means removal of the oxide film or the like which is naturally formed. This intentionally eliminates the surface potential which has been generated by the natural oxide film or the like.

Incidentally, absolutely the same result is obtained even if Ge is used in place of Si and if a nitride film is used in place of the oxide film.

In the case of such a semiconductor sample, e.g., GaAs or CdS, a similar effect can be attained by performing the control of the aforementioned Dember voltage or diffusion photovoltage. In case the diffusion photovoltage is controlled, the surface states $N_{ss}$ are thought to operate as the recombination centers of the current carriers, and the carriers generated by the light are effectively reduced at the portion irradiated with the electron beam. As a result, the diffusion photovoltage is decreased.

Although the description thus far made is directed to the case in which the electron beam is used as an energetic particle beam, the same applies to the X ray and the laser beam. In the case of the ion beam, moreover, similar effects to those of the case of the electron beam can be attained. However, since the ion has a mass greater than the electron, the surface is frequently damaged in a mechanical manner. As a result, the surface potential is frequently lowered so that the surface photovoltage is usually decreased.

Information Recording Method

Next, a concrete recording method will be described on the basis of the fundamental principle of the present invention thus far described.

Figure 6:
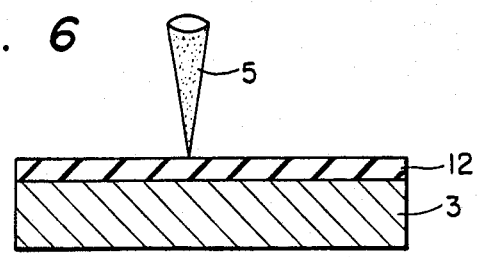
FIG. 6 is a schematic view for illustrating the recording method according to the present invention.

FIG. 6 shows the section of an information recording medium so as to illustrate the information recording method according to the present invention. There is shown a case in which a p-type Si wafer is used as the bulk semiconductor base plate 3. The p-type Si wafer 3 is formed with the $SiO_2$ film 12 on the surface thereof. The thickness of the $SiO_2$ film 12 is about 100 5000 Å. Thus, if the $SiO_2$ film 12 having a suitable thickness is formed on the p-type Si wafer 3, the positive charges causing a high surface potential to be generated at the wafer surface are fixed. Moreover, an inversion layer is formed at the surface of the p-type Si wafer 3.

If the surface of the recording medium thus prepared is irradiated with the electron beam 5, the surface photovoltage generated at the irradiated area is far lower than that generated at the non-irradiated area. In other words, this implies that the surface photovoltage of the irradiated area is remarkably decreased by irradiating the surface of the p-type Si wafer 3, which is formed with the $SiO_2$ film 12 having such a thickness as allows the inversion layer to be formed at the interface, with the electron beam in a necessary dosage. This corresponds to the energy level diagrams of FIGS. 3B and 4B, as has been described hereinbefore.

Figure 7:
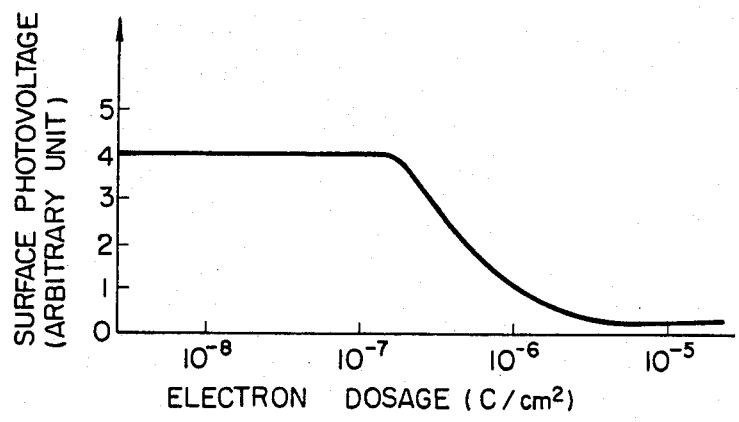
FIGS. 7 and 8 are graphs illustrating the relationships between the surface photovoltage and the electron dosage of the recording method shown in FIG. 6, respectively.

FIG. 7 shows the relationship between the dosage ($C/cm^2$) of the electron beam, which is to be irradiated upon the recording medium formed with that inversion layer, and the surface photovoltage (in an arbitrary unit) at the irradiated area. This relationship is obtained by the experiments which were conducted with the accelerating voltage of the electron beam at 20 kV. As is seen from FIG. 7, no decrease in the surface photovoltage at the irradiated area is found in the least for an electron dosage lower than $1 \times 10^{-7}$ $C/cm^2$, and the surface photovoltage itself is constant at a high level. If the dosage exceeds $1 \times 10^{-7}$ $C/cm^2$, on the contrary, the surface photovoltage at the irradiated area is gradually decreased. When the dosage reaches $1 \times 10^{-6}$ $C/cm^2$, the surface photovoltage at the irradiated area is substantially completely decreased.

As a result, letters, an image, binary information and so on can be written by scanning the electron beam on the p-type wafer which is formed with the SiO$_2$ film having such a thickness as allows the inversion layer to be formed at the interface.

Next, the case in which an n-type Si wafer is used as the bulk semiconductor base plate 3 will be described in the following. The n-type Si wafer need not have its surface formed with an oxide film as is different from the case of the p-type Si wafer. In order to generate a high surface potential on the n-type Si wafer, it is sufficient to wash the surface of that wafer in an alkaline solution. In other words, negative charges are generated on the surface of the n-type Si wafer by the washing process in the alkaline solution. As a result, a high surface potential can be generated in the n-type Si wafer. This corresponds to the energy level diagram of FIG. 5B, as has been described hereinbefore. The surface photovoltage as the irradiated area is remarkably prominently decreased by irradiating such n-type Si wafer with the electron beam in a necessary dosage. Thus, letters, an image, binary information and so on can be written in by scanning an electron beam similarly to the p-type Si wafer. Incidentally, the suitable alkaline solution thus far described has been found to be either a mixture solution of ammonia and hydrogen peroxide or a mixture solution of ammonia and hydrochloric acid.

In accordance with the recording method thus far described, the recording medium, in which a high surface potential has been generated in advance, is irradiated with an electron beam thereby to restrain generation of a surface photovoltage at the irradiated area so that information may be recorded. Next, the following description is directed to the case in which the generation of the surface photovoltage at the irradiated area is promoted to effect the recording operation. The information recording medium in this case is formed with a very thin SiO$_2$ film on the surface of the p-type Si wafer. The thickness of the SiO$_2$ film is about 10 to 50 Å. If the SiO$_2$ film is made very thin, as in the above, the effect of the positive charges to be fixed on the SiO$_2$ film is effectively reduced. This results in the remarkably limited generation of the surface potential. More specifically, if the SiO$_2$ is made to have such small thickness, not the inversion layer but only the depletion layer is formed at the interface.

If the surface of such recording medium is irradiated with an electron beam in a necessary dosage, the output of the surface photovoltage to be obtained from the irradiated area becomes far higher than that of the surface photovoltage to be obtained from the non-irradiated area. In other words, the surface photovoltage of the irradiated area is remarkably increased by irradiating the surface of the p-type Si wafer, which is formed with the SiO$_2$ film having such a thickness as allows a depletion layer to be formed at the interface, with the electron beam in the necessary dosage. This corresponds to the energy level diagrams of FIGS. 3A and 4A, as has been described hereinbefore.

Figure 8:
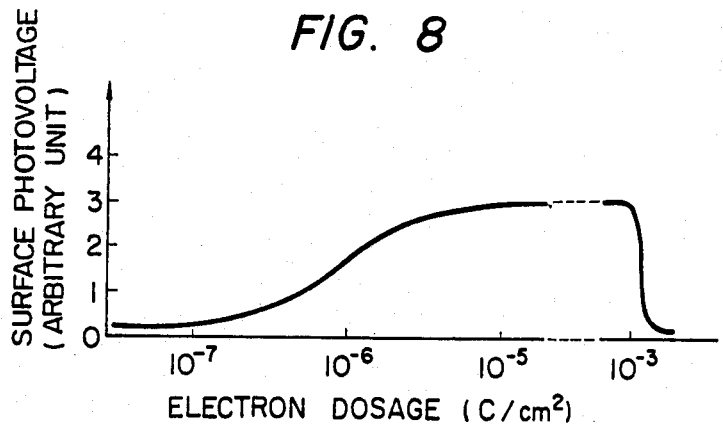

FIG. 8 shows the relationship between the dosage (C/cm$^2$) of the electron beam, which is to be irradiated upon the recording medium formed with that depletion layer, and the surface photovoltage (in an arbitrary unit) at the irradiated area. This relationship is obtained by the experiments which were conducted with the accelerating voltage of the electron beams at 20 kV. As is seen from FIG. 8, little increase in the surface photovoltage at the irradiated area is found for an electron dosage lower than $1 \times 10^{-7}$ C/cm$^2$, and the surface photovoltage itself is constant at a low level. If the dosage reaches $1 \times 10^{-7}$ C/cm$^2$, on the contrary, the surface photovoltage at the irradiated area is slightly increased. While the dosage is higher than $1 \times 10^{-7}$ C/cm$^2$ and lower than $1 \times 10^{-5}$ C/cm$^2$, the surface photovoltage at the irradiated area is gradually augmented until its level for the dosage at $1 \times 10^{-5}$ C/cm$^2$ is remarkably increased with respect to the surface photovoltage at the non-irradiated area. When the dosage exceeds $1 \times 10^{-5}$ C/cm$^2$, the surface photovoltage at the irradiated area is saturated at a high constant level. When the dosage exceeds $1 \times 10^{-3}$ C/cm$^2$, on the contrary, the surface photovoltage at the irradiated area is abruptly dropped to lose the increasing effect.

Thus, letters, an image, binary information and so on can be written in by scanning the p-type Si wafer, which is formed with the SiO$_2$ film having such a thickness as allows the depletion layer to be formed at the interface, with the electron beam.

Next, the case in which the n-type Si wafer is used as the bulk semiconductor base plate will be described in the following. The n-type Si wafer need not be formed with any oxide film on the surface thereof as is different from the case of the p-type Si wafer. In order to generate a remarkably low surface potential in the n-type Si wafer, it is sufficient to wash the surface of that wafer in an alkaline solution. In other words, a remarkably few negative charges are generated on the surface of the n-type Si wafer by the washing process in the alkaline solution. As a result, a remarkably low surface potential can be generated in the n-type Si wafer. This corresponds to the energy level diagram of FIG. 5A, as has been described hereinbefore. The surface photovoltage at the irradiated area is remarkably prominently increased by irradiating such n-type Si wafer with the electron beam in a necessary dosage. Thus, letters, an image, binary information and so on can be written in by scanning an electron beam similarly to the p-type Si wafer.

Incidentally, the above alkaline solution may be the same as the aforementioned one but need have its mixing ratio and washing time period changed. More specifically, in case the inversion layer is formed at the interface, it is sufficient to use a solution which contains hydrogen peroxide or hydrochloric acid at a higher ratio than ammonia. In case the depletion layer is formed at the interface, on the contrary, it is sufficient to use a washing solution having a low ratio.

In accordance with the recording method thus far described, the recording medium, in which a high or remarkably low surface potential has been generated in advance, is irradiated with the electron beam thereby to decrease or increase the surface photovoltage at the irradiated area so that information may be recorded. Next, the case, in which the recording medium prepared by eliminating the surface potential in advance is irradiated with the electron beam thereby to promote the generation of the surface photovoltage at the irradiated area so that information may be recorded, will be described in the following. The recording medium in this case is prepared by washing the surface of a p- or n-type Si wafer in the solution of hydrofluoric and nitric acids, as has been described hereinbefore. This solution of hydrofluoric and nitric acids is not special but may be the washing solution which is used in the usual semiconductor fabrication process. If the surface of the p- or n-type Si wafer is washed in that way with the solution of hydrofluoric and nitric acids, the natural oxide film, which may have been formed by that time, is removed. In other words, the surface potential is not generated in the p- or n-type Si wafer, but the respective levels are plotted in a straight line on the energy level diagram. The surface photovoltage at the irradiated area is remarkably prominently increased by irradiating such p- or n-type Si wafer with the electron beam in the necessary dosage. Thus, letters, an image, binary information and so on can be written in by scanning the p- or n-type Si wafer with the electron beam.

According to the recording method thus far described, the recording medium having its surface treated in advance is irradiated with the electron beam thereby to restrain or promote the generation of the surface photovoltage at the irradiated area so that information may be recorded. The following description is directed to the case in which the recording medium having no surface treated is irradiated with the electron beam thereby to restrain the generation of the surface photovoltage at the irradiated area. A suitable recording medium in this case is a p- or n-type CdS wafer. Since this wafer is reluctant to generate the surface potential, the writing operation is performed by controlling either the Dember voltage or the diffusion photovoltage, as has been described hereinbefore. In other words, the diffusion photovoltage at the irradiated area is remarkably prominently decreased by irradiating the p- or n-type CdS wafer, for example, with the electron beam in the necessary dosage. Thus, letters, an image, binary information and so on can be written in by scanning the electron beam on the p- or n-type CdS wafer.

Information Read-out Method

Next, the read-out method of the information which is written in the aforementioned information recording medium will be described hereinafter.

Figure 9:
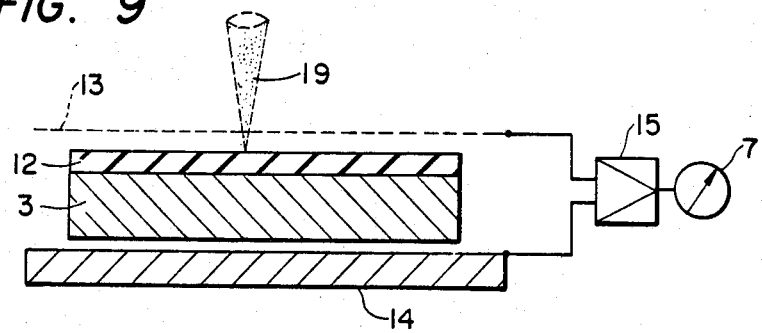
FIG. 9 is a schematic view for illustrating the read-out method.

FIG. 9 shows the fundamental construction of the read-out machine so as to illustrate the information read-out method. In FIG. 9, there is used as the recording medium a structure which is prepared by forming the SiO$_2$ film 12 on the surface of the p-type Si wafer 3. The recording medium thus prepared is sandwiched between a wafer-supporting metal electrode 14 and a transparent electrode 13. An optical beam 19, which is modulated in an a.c. manner, is irradiated upon the recording medium through the transparent electrode 13. The optical beam 19 is scanned all over the surface of the recording medium. As a result, the fine change in the surface photovoltage, which is obtained from the irradiated area, is detected by means of a phase-sensitive (demodulation) amplifier 15 which is connected between the two electrodes 13 and 14. Then, the signal thus detected is fed to the meter 7 so that the change in the surface photovoltage is observed. In other words, the low surface photovoltage thus converted into the alternate current is detected by the condenser coupling (or capacitive coupling). This is because the SiO$_2$ film 12 is intrinsically made of such an insulator as to make it difficult to extract the generated surface photovoltage in a d.c. manner.

Here, the generating process of the surface photovoltage will be described hereinafter. If the SiO$_2$ film 12 is formed on the p-type Si wafer 3, the positive charges causing the surface potential to be generated are fixed at the interface of the SiO$_2$ film 12, as has been described hereinbefore. On the other hand, the p-type Si wafer 3 has its interface formed with either an inversion layer or a depletion layer. Then, the interface between such p-type Si wafer 3 and SiO$_2$ film 12 is irradiated with the optical beam 19, electrons and positive holes are generated in pairs. Of the pairs of those electrons and positive holes, the electrons are moved to the SiO$_2$ film 12 by the electric field which is generated by the positive charges fixed at the interface of the SiO$_2$ film 12. On the other hand, the positive holes are moved to the back side of the p-type Si wafer 3 by the action of that electric field. As a result, the SiO$_2$ film 12 is charged with a negative polarity, and the back side of the p-type Si wafer 3 is charged with a positive polarity. In other words, a voltage is generated between both the terminals of the recording medium and is called the "surface photovoltage".

Here, although the magnitude of that surface photovoltage is dependent upon the surface potential, as has been described hereinbefore, it is determined by the effect of the positive charges which are fixed at the interface of the SiO$_2$ film 12. This effect of the positive charges is restrained or promoted by the irradiation with the electron beam in the necessary dosage. As a result, the letters, image, binary information and so on, which are written by the electron beam in the necessary dosage on the recording medium, are detected in terms of the magnitude of the surface photovoltage by the scanning operations with the optical beam 19.

Incidentally, the example of the read-out method thus far described applies to the recording medium which is prepared by forming the SiO$_2$ film 12 on the p-type Si wafer 3, but it can naturally apply in a similar manner to the various recording mediums thus far described.

Information Recording Machine

An electron beam drafting (or exposure) machine, which is commercially available, can be used as the recording machine for information recording, according to the present invention with the use of an electron beam. The electron beam drafting machine is usually charged with an Si wafer having a diameter of 3 inches so that it can draft any pattern, English letter and numeral on the Si wafer at any place. If the dosage of the electron beam is set at $3 \times 10^{-6}$ C/cm$^2$, the electron beam drafting machine can establish a spot having a diameter of 0.1 $\mu$mm and a current density of 10 A/cm$^2$. As a result, the recording time becomes $3 \times 10^{-7}$ sec per dot (which may be thought to correspond to one bit) so that the recording operation of 3.3M bits per second can be ensured. This value is not inferior to the recording velocity using the magnetic tape according to the prior art.

Information Read-out Machine

Figure 10:
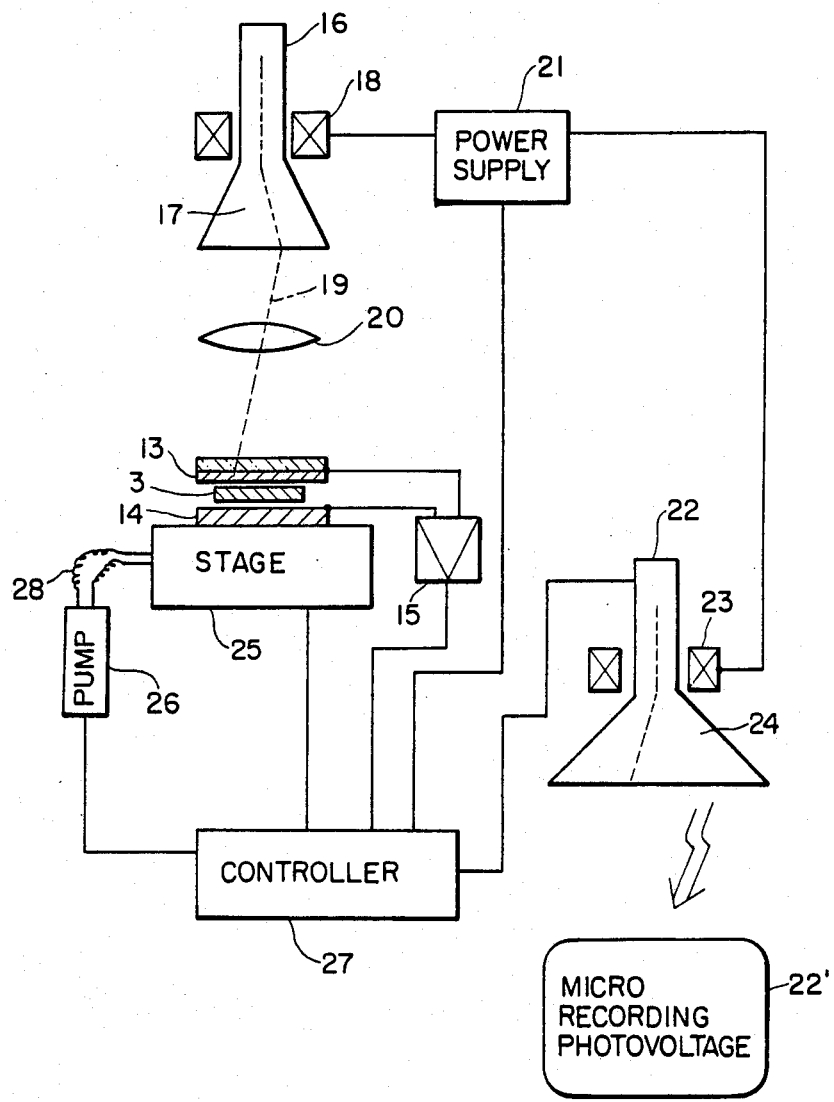
FIGS. 10 is a view showing the concrete construction of a read-out machine.

FIG. 10 shows one embodiment of a recording medium read-out machine according to the present invention. This shows the case in which the record according to the present invention is used as a kind of office-use microfilm for recording sentences or the like.

The wafer 3, which has a recording medium such as an oxide film recorded by means of the electron beam drafting machine, is set on the electrode 14 through a suitable adaptor. The electrode 14 is fixed on a specimen stage 25 which is made movable in X and Y directions and which is connected through a flexible evacuating tube 28 with a vacuum pump 26, thus constructing a vacuum chuck for the wafer 3. This vacuum chuck is operated by the control signal of a controller 27 which is equipped with a micro-computer. The transparent electrode 13, which allows a light to pass therethrough, is placed above and in the vicinity of the wafer 3. A spacer such as a Myler sheet of about 10 μm in thickness may be interposed between the transparent electrode 13 and the wafer 3 with a view of protecting the wafer 3. The bright spot of a cathode ray tube (CRT) 16 with a very fine beam spot is used as the read-out optical beam 19. More specifically, if the electron beam 17 of the CRT 16 is scanned on the picture frame of the CRT 16 by means of a deflector 18, the bright spot of about 50 μm comes as the scanning spot (or optical beam) 19 out of the picture frame of the CRT 16. If this bright spot (or optical beam) 19 is focused to project upon the wafer 3 by means of a lens 20, it is made to scan the wafer 3 by the scanning operation of the electron beam 17. If the demagnification factor of the lens 20 is assumed to be one fifyth, for example, the diameter of the optical beam 19 becomes about 1 μm on the wafer 3. The resolution of 0.1 μm cannot be expected as it is but is improved in the detecting process of the surface photovoltage, which will be described in the following. The surface photovoltage cannot be detected in a d.c. manner, as has been described hereinbefore, but is capacitively detected through the oxide film by means of the electrode 13 in the present embodiment being described. As a result, the detection is frequently performed by making the optical beam 19 pulsate so that the surface photovoltage is converted into an alternate current, and that means can be used in the present embodiment. In the present embodiment, however, the case in which the wafer 3 is scanned by the use of the d.c. optical beam 19 with a view to improving the aforementioned resolution will be described in the following. As a result, the electrodes 13 and 14 detect the signal only in case the voltage changes on the wafer 3. More specifically, when the optical beam 19 comes to the area which is recorded by the electron beam, the surface photovoltage becomes either substantially zero or remarkably high so that the boundary is highly strengthened and detected. In other words, a differentiated wave form is detected. As a result, the boundary of the recorded spot can be detected with a high resolution of 0.1 μm by amplifying that wave form either as it is by means of the wide band amplifier 15 or after the phase inversion and by shaping the amplified wave form by means of the controller 27. If the brightness of the electron beam of a CRT 22, which is operative to scan in synchronism with the CRT 16, is modulated by the output signal processed by the controller 27, the scanned image 22' by the surface photovoltage can be obtained on the picture frame of the CRT 22, as is well known in a scanning electron microscope or the like. The case of changing the magnification of the scanned image 22' is performed by resetting a scanning power supply 21 in accordance with the indication of the controller 27 thereby to change the current to be supplied to the deflection coil 18. On the other hand, a higher change in the magnification is performed by replacing the lens 20. Thus, the recorded information can be read out with a high resolution without deteriorating the fineness of the record using the electron beam.

Figure 1A:
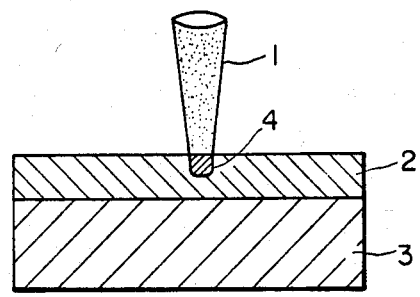
FIGS. 1A and 1B and FIGS. 2A, 2B, 2C and 2D are schematic process views for illustrating information recording methods according to the prior art, respectively.
Figure 1B:
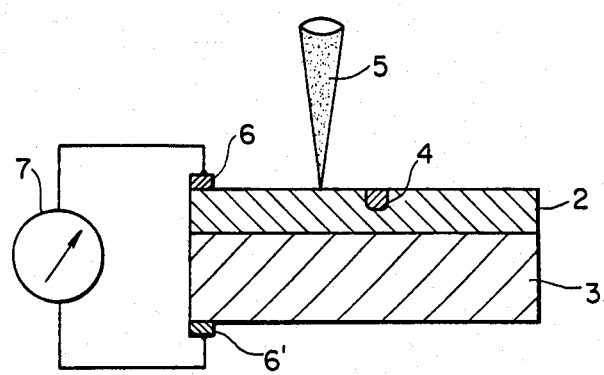
Figure 2A:
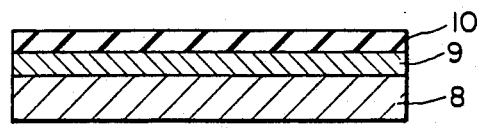
Figure 2B:
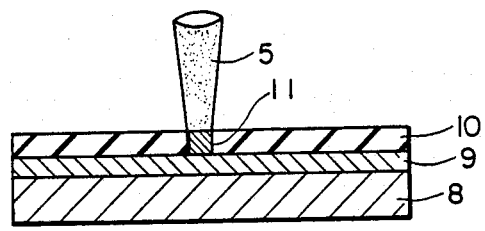
Figure 2C:
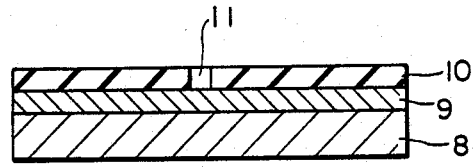
Figure 2D:
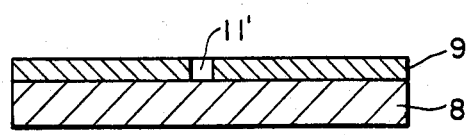

Now, the recording medium according to the present invention is advantageous over the conventional example shown in FIGS. 1A and 1B in the following points:
(1) The fabrication process is simple because the recording medium has no p-n junction but only an oxide film;
(2) The process of forming an electrode for each wafer is not required because the output signal is detected by the capacitive coupling; and (3) The reuse of the wafer can be made merely by eliminating the irradiating effect by the annealing operation or by removing the oxide film at most. Since the process of forming the oxide film on the wafer is a routine pre-processing of the usual IC fabrication process, as is well known in the art, it is not too much to say that any specially intended pre-processing can be dispensed with in the present invention, if the use of its effect for other purposes is taken into consideration. As has been described hereinbefore, on the other hand, the method of the present invention is highly advantageous over the method using the electron resist among the recording methods using the electron beam in that it requires none of the post-processings such as the developing process. Since the laser beam can be used for the recording operation, moreover, the method of the present invnetion requires no special vacuum container, as is different from the cases using the electron beam, the ion beam or the X ray, so that it can enjoy a high industrial merit when its convenience is converted into the cost for facilities.

Incidentally, it goes without saying that the read-out machine thus far described can be applied to not only the recording medium according to the present invention but also the read-out of the recording medium according to another method.

As has been described hereinbefore, according to the information recording method according to the present invention, the p- or n-type semiconductor wafer is irradiated with an energetic particle beam such as an electron beam thereby to control such as decrease or increase the generation of the surface photovoltage at the irradiated area so that information may be recorded on the wafer. As a result, the process required for the recording operation can be remarkably shortened, and the recording medium can be fabricated at a low cost.

We claim:
1. A method of information recording on a semiconductor base plate, comprising:
   irradiating a limited area of a bulk semiconductor base plate with an energetic particle beam, which has sufficient energy to generate radiation damage at said limited area to thereby control generation of a surface photovoltage, so that information is recorded on said bulk semiconductor base plate by the energetic particle beam;
   irradiating the surface of the bulk semiconductor base plate with an optical beam; and
   detecting a surface photovoltage generated by the irradiation of the optical beam by electrodes disposed so as to oppose each other with a gap into which the semiconductor base plate can be inserted, so that the information is read out by detecting the photovoltage.
2. An information recording method according to claim 1, further characterized in that said bulk semiconductor base plate has a high surface potential generated in advance of said irradiation on the surface thereof by surface potential generating means so that the surface photovoltage at said limited area may be decreased by said irradiation.
3. An information recording method according to claim 2, further characterized: in that said bulk semiconductor base plate is a p-type semiconductor base plate; and in that said surface potential generating means is prepared by forming an oxide or nitride film on said base plate.

4. An information recording method according to claim 2, further characterized: in that said bulk semiconductor base plate is an n-type semiconductor base plate; and in that said surface potential generating means is prepared by washing the surface of said base plate in an alkaline solution.

5. An information recording method according to claim 2, further characterized in that said bulk semiconductor base plate is a p- or n-type Si wafer.

6. An information recording method according to claim 2, further characterized in that said energetic particle beam is an electron beam.

7. An information recording method according to claim 1, further characterized in that said bulk semiconductor base plate has a remarkably low surface potential generated in advance of said irradiation on the surface thereof by surface potential generating means so that the surface photovoltage at said limited area may be increased by said irradiation.

8. An information recording method according to claim 7, further characterized in that said bulk semiconductor base plate is a p- or n-type Si wafer.

9. An information recording method according to claim 7 further characterized in that said energetic particle beam is an electron beam.

10. An information recording method according to claim 7, further characterized: in that said bulk semiconductor base plate is a p-type semiconductor base plate; and in that said surface potential generating means is prepared by forming an oxide or nitride film on said base plate.

11. An information recording method according to claim 7, further characterized: in that said bulk semiconductor base plate is an n-type semiconductor base plate; and in that said surface potential generating means is prepared by washing the surface of said base plate in an alkaline solution.

12. An information recording method according to claim 1, further characterized in that said bulk semiconductor base plate has its surface potential eliminated in advance of said irradation by surface potential eliminating means so that the surface photovoltage at said limited area may be inserted by said irradiation.

13. An information recording method according to claim 12, further characterized in that said surface potential eliminating means effects the elimination by washing the surface of said base plate in the solution of hydrofluoric and nitric acids.

14. An information recording method according to claim 12, further characterized in that said bulk semiconductor base plate is a p- or n-type Si wafer.

15. An information recording method acording to claim 12, further characterized in that said energetic particle beam is an electron beam.

16. An information recording method according to claims 2, 7 or 12, further characterized in that said bulk semiconductor base plate is a p- or n-type Si wafer.

17. An information recording method according to claims 2, 7 or 12, further characterized in that said energetic particle beam is an electron beam.

18. A method of information recording on a semiconductor wafer, characterized in that a limited area of a bulk semiconductor base plate is irradiated with an energetic particle beam having sufficient energy to generate a surface state at said limited area thereby to control generation of a surface photovoltage at said limited area so that information may be recorded on said bulk base plate, further characterized in that said bulk semiconductor base plate has a high surface potential generated in advance on the surface thereof by surface potential generating means so that the surface photovoltage at said limited area may be decreased, and further characterized in that said bulk semiconductor base plate is an n-type semiconductor base plate; and in that said surface potential generating means is prepared by washing the surface of said base plate in an alkaline solution.

19. A method of information recording on a semiconductor wafer, characterized in that a limited area of a bulk semiconductor base plate is irradiated and an energetic particle beam having sufficient energy to generate a surface state at said limited area thereby to control generation of a surface photovoltage at said limited area so that information may be recorded on said bulk base plate, further characterized in that said bulk semiconductor base plate has a remarkably low surface potential generated in advance on the surface thereof by surface potential generating means so that the surface photovoltage at said limited area may be increased, and further characterized in that said bulk semiconductor base plate is an n-type semiconductor base plate; and in that said surface potential generating means is prepared by washing the surface of said base plate in an alkaline solution.

20. A method of information recording on a semiconductor wafer, characterized in that a limited area of a bulk semiconductor base plate is irradiated with an energetic particle beam having sufficient energy to generate a surface state at said limited area thereby to control generation of a surface photovoltage at said limited area so that information may be recorded on said bulk base plate, further characterized in that said bulk semiconductor base plate has its surface potential eliminated in advance by surface potential eliminating means so that the surface photovoltage at said limited area may be increased, and further characterized in that said surface potential eliminating means effects the elimination by washing the surface of said base plate in the solution of hydrofluoric and nitric acids.

* * * * *